United States Patent
Chen

(10) Patent No.: US 8,966,154 B2
(45) Date of Patent: Feb. 24, 2015

(54) DATA PROGRAMMING CIRCUIT AND METHOD FOR OTP MEMORY

(75) Inventor: Yung-Wei Chen, Taipei (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 856 days.

(21) Appl. No.: 13/215,045

(22) Filed: Aug. 22, 2011

(65) Prior Publication Data

US 2012/0066437 A1 Mar. 15, 2012

(30) Foreign Application Priority Data

Sep. 13, 2010 (TW) ................................. 99130829 A

(51) Int. Cl.
*G06F 12/00* (2006.01)
*G11C 16/10* (2006.01)

(52) U.S. Cl.
CPC .......... *G11C 16/102* (2013.01); *G11C 2216/26* (2013.01)
USPC .......................................... 711/102; 717/168

(58) Field of Classification Search
CPC .................................................... G11C 16/102
USPC ........................................... 711/102; 717/168
See application file for complete search history.

(56) References Cited

U.S. PATENT DOCUMENTS

| | | | |
|---|---|---|---|
| 6,006,305 A | 12/1999 | Fox | |
| 6,836,834 B2 | 12/2004 | Schulze et al. | |
| 7,778,074 B2 | 8/2010 | Ahmed | |
| 2004/0098428 A1 | 5/2004 | Schulze et al. | |
| 2006/0179328 A1* | 8/2006 | Lii | .................................. 713/193 |
| 2007/0025134 A1 | 2/2007 | Riva Reggiori et al. | |
| 2007/0208908 A1 | 9/2007 | Moore et al. | |
| 2007/0226400 A1 | 9/2007 | Tsukazaki | |
| 2008/0258757 A1 | 10/2008 | Archibald et al. | |
| 2009/0146687 A1 | 6/2009 | Archibald et al. | |
| 2009/0327625 A1* | 12/2009 | Jaquette et al. | ................ 711/160 |
| 2010/0082917 A1 | 4/2010 | Yang et al. | |

OTHER PUBLICATIONS

English language translation of abstract of CN 101093727 (published Dec. 26, 2007).
English language translation of abstract of CN 101495972 (published Jul. 29, 2009).

* cited by examiner

*Primary Examiner* — Kalpit Parikh
(74) *Attorney, Agent, or Firm* — McClure, Qualey & Rodack, LLP

(57) ABSTRACT

A data programming circuit is provided. A one-time-programmable (OTP) stores a first version of encoding data corresponding to a first version of a read-only memory (ROM) code. A control unit stores a second version of the ROM code into the OTP memory, wherein the control unit obtains a matching table according to the first version of the encoding data and the second version of the ROM code. The control unit obtains a first data segment of the first version of the encoding data and a second data segment of the second version of the ROM code that have the same content, according to the matching table. The control unit encodes the second data segment as a specific address, and the specific address points to the first data segment of the first version of the encoding data in the OTP memory.

10 Claims, 8 Drawing Sheets

DATA PROGRAMMING CIRCUIT AND METHOD FOR OTP MEMORY

CROSS REFERENCE TO RELATED APPLICATIONS

This Application claims priority of Taiwan Patent Application No. 099130829, filed on Sep. 13, 2010, the entirety of which is incorporated by reference herein.

BACKGROUND OF THE INVENTION

1. Field of the Invention

The present invention is related to one-time-programmable (OTP) memories, and more particularly to data programming methods for OTP memories.

2. Description of the Related Art

With the rapid development of consumer electronic products, solid-state data storage has become increasingly important. The small size, simple structure, and low cost of the solid-state data storage are especially desired for portable consumer products. Solid-state data storage technologies (e.g. EPROM, EEPROM etc.) have been optimized for high-speed applications, resulting in complex and expensive processes.

However, for many consumer applications, low cost is more important than speed. Thus, a non-volatile one-time-programmable (OTP) memory having lower manufacturing cost, in which stored information does not disappear even when the power supply is turned off, is an essential element. The OTP memory is widely used for the purposes of, e.g., redundancy of a large-capacity memory such as a DRAM or SRAM, calibrating of an analog circuit, code storage of, e.g., an encryption key, and storage of management information such as the log in the fabrication process. Furthermore, the OTP memory is characterized by that the data stored therein can only be programmed once. In other words, data modification on any of the memory cells of the OTP memory is not allowed once the memory cell is programmed.

For an OTP read only memory (ROM), data can be written into the memory after leaving the factory, i.e. the operating environment and applications of the memory can be programmed through a write-in operation carried out by users in their premises. Thus, the OTP memory is more convenient to use when compared with other memories, such as a mask ROM.

BRIEF SUMMARY OF THE INVENTION

A data programming circuit and a data programming method are provided. An embodiment of a data programming circuit is provided. The data programming circuit comprises a one-time-programmable (OTP) memory and a control unit. The OTP memory stores a first version of the encoding data corresponding to a first version of a read-only memory (ROM) code. The control unit stores a second version of the ROM code into the OTP memory, wherein the control unit obtains a matching table according to the first version of the encoding data and the second version of the ROM code. The control unit obtains a first data segment of the first version of the encoding data and a second data segment of the second version of the ROM code that have the same content, according to the matching table. The control unit encodes the second data segment as a specific address, and the specific address points to the first data segment of the first version of the encoding data in the OTP memory.

Furthermore, an embodiment of a data programming method for a one-time-programmable (OTP) memory is provided, wherein a first version of the encoding data corresponding to a first version of a read-only memory (ROM) code is stored in the OTP memory. The first version of the encoding data is read from the OTP memory and the first version of the encoding data is decoded to obtain the first version of the ROM code. A second version of the ROM code is encoded according to the first version of the ROM code. A matching table is obtained according to the first and second versions of the ROM codes. According the matching table, a first data segment of the first version of the encoding data and a second data segment of the second version of the ROM code that have the same content are obtained. The second data segment is encoded as a specific address, and the specific address points to the first data segment of the first version of the encoding data in the OTP memory. The second version of the encoded ROM code is stored into the OTP memory.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
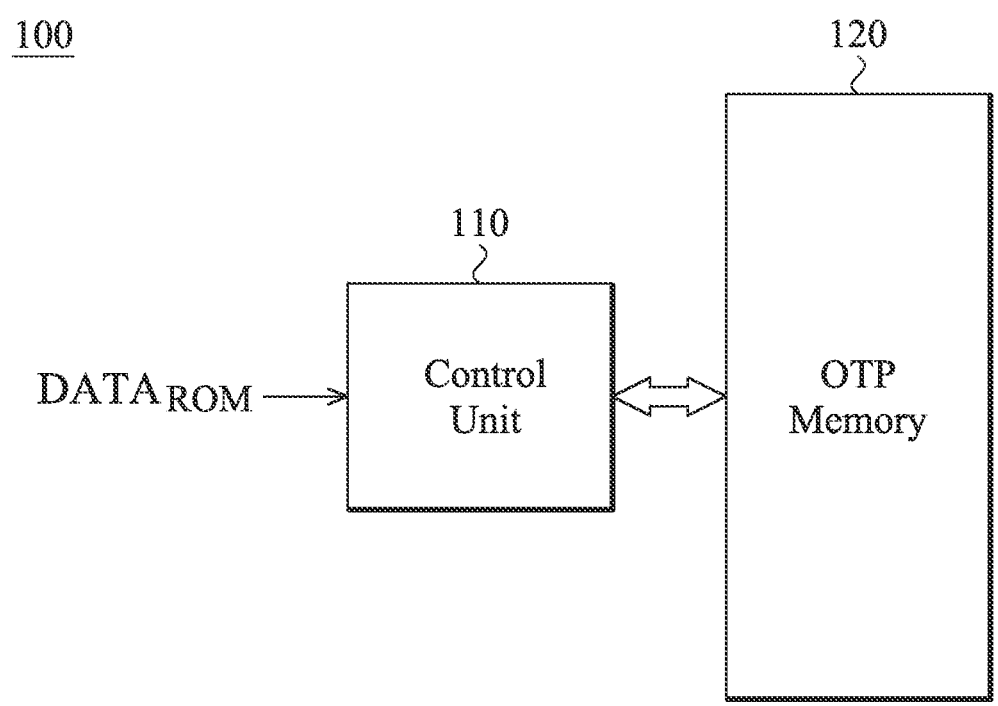
FIG. 1 shows a data programming circuit according to an embodiment of the invention.

FIG. 1 shows a data programming circuit 100 according to an embodiment of the invention. The data programming circuit 100 comprises a control unit 110 and a one-time-programmable (OTP) memory 120. In the data programming circuit 100, a read-only memory (ROM) code $DATA_{ROM}$ is processed (e.g. encoded, compressed and so on) by the control unit 110, and then the processed data is stored into the OTP memory 120, thus using a smaller storage capacity to store the ROM code $DATA_{ROM}$ for a user. In addition, the data programming circuit 100 can be applied to various electronic products.

Figure 2:
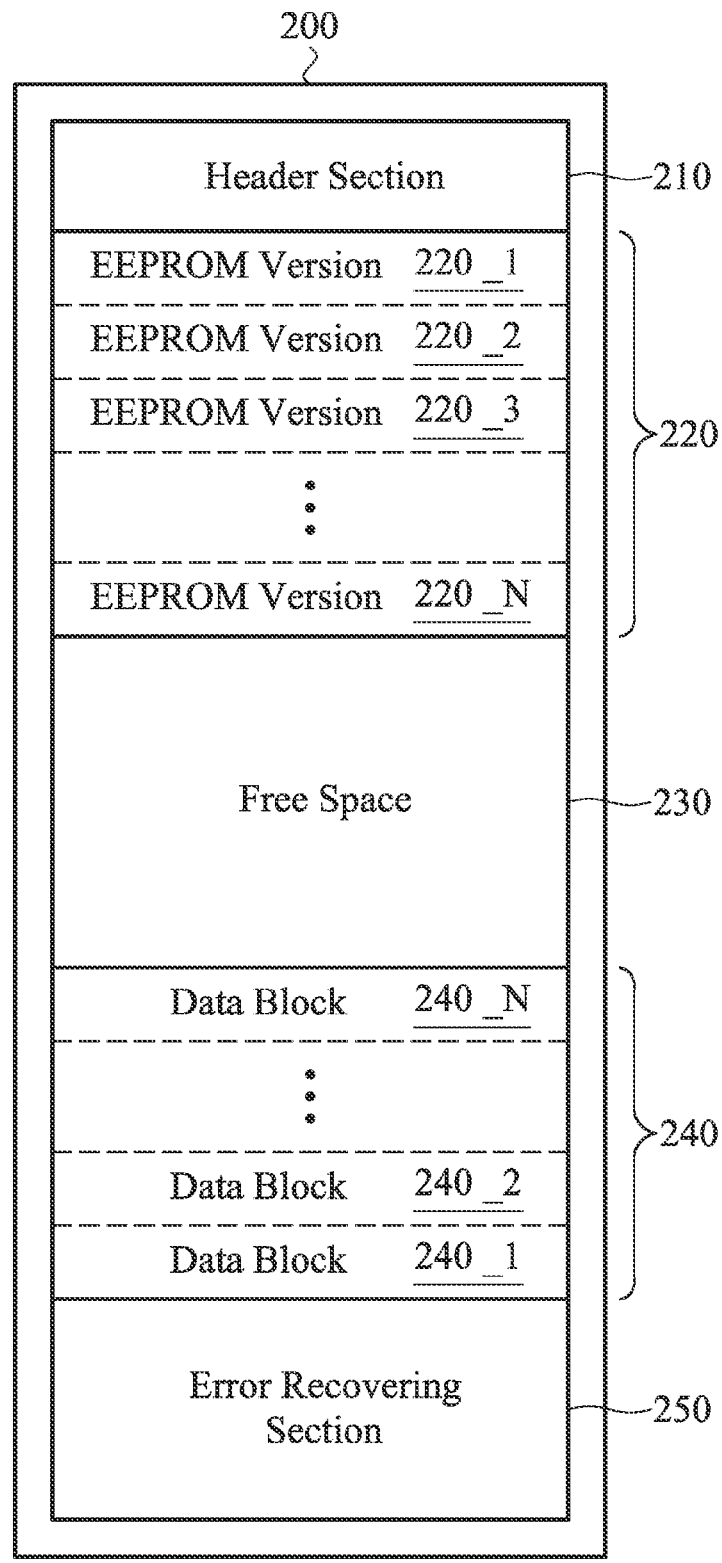
FIG. 2 shows a layout diagram illustrating a memory map of the data stored in an OTP memory according to an embodiment of the invention.

FIG. 2 shows a layout diagram illustrating a memory map of the data stored in an OTP memory 200 according to an embodiment of the invention. The OTP memory 200 is divided into various sections. For example, in FIG. 2, the OTP memory 200 comprises a header section 210, a data section 220, a free space 230, a start address stack section 240 and an error recovering section 250, wherein each of the sections is formed by a plurality of bytes. The header section 210 is used to store major information of the OTP memory 200, such as an actual size of the OTP memory 200, whether the OTP memory 200 can continue to be written or whether the OTP memory 200 can be used/read (i.e. whether to bypass the OTP memory 200 due to the OTP memory 200 being damaged). The data section 220 comprises a plurality of EEPROM versions 220_1 to 220_N which are the encoded EEPROM versions previously written to the OTP memory 200, wherein each of the EEPROM versions comprises a plurality of data segments. The free space 230 is the space that is not used in the OTP memory 200. The start address stack section 240 is used to store a start address and an end address of each EEPROM version in the data section 220, and the start address stack section 240 is also used to record whether each EEPROM version is normal or not. The error recovering section 250 has a fixed size, which is used to record the information, e.g. data to be stored in the damaged memory cells of the OTP memory 200 and addresses corresponding to the damaged memory cells, for a access unit of the OTP memory 200 (e.g. the control unit 110 of FIG. 1) to perform recovery.

Referring to FIG. 1 and FIG. 2 together, the content of the OTP memory 200 is installed to "0" by the control unit 110 first. Next, the control unit 110 writes the first encoded EEPROM version 220_1 below the header section 210. In the embodiment, the control unit 110 writes data into the OTP memory 200 with byte per unit. Moreover, before writing the EEPROM version 220_1 into the OTP memory 200, the control unit 110 obtains the start and end addresses corresponding to the EEPROM version 220_1 according to data length of the EEPROM version 220_1 and writes the start and end addresses into the start address stack section 240. In the embodiment, the control unit 110 writes the start and end addresses of the EEPROM version 220_1 into the different fields within a data block 240_1, wherein the data block 240_1 is adjacent to the error recovering section 250. Similarly, the control unit 110 may sequentially write the new EEPROM versions (e.g. the EEPROM versions 220_2 to 220_N) into the free space 230, so as to update the OTP memory 200. In the meantime, the control unit 110 also writes the start and end addresses of the update EEPROM version into the different fields of the corresponding data block in the start address stack section 240. For example, the start and end addresses corresponding to the EEPROM version 220_2 are stored in a data block 240_2, and the start and end addresses corresponding to the EEPROM version 220_N are stored in a data block 240_N. In the embodiment of FIG. 2, the control unit 110 updates the EEPROM versions into the OTP memory 200 with a top-down approach, i.e. in a direction from the header section 210 to the start address stack section 240. In addition, the control unit 110 writes the start and end addresses corresponding to the updated EEPROM versions into the OTP memory 200 with a bottom-up approach, i.e. in a direction from the error recovering section 250 to the data section 220.

In FIG. 2, the free space 230 is between the data section 220 and the start address stack section 240. Therefore, before writing the new EEPROM version into the OTP memory 200, the control unit 110 needs to confirm whether the free space 230 has enough space for storage. If yes, the control unit 110 writes the start and end addresses corresponding to the new EEPROM version into the start address stack section 240, and then the control unit 110 writes data of the new EEPROM version into the free space 230 below the last version EEPROM data. On the contrary, if the free space 230 does not have enough space to store the new EEPROM version, the control unit 110 does not perform any writing program for the OTP memory 200.

Due to process drift, some memory cells may be damaged in the OTP memory 200. Therefore, after a byte data is written into a data block corresponding to a specific address in the OTP memory 200, the control unit 110 must proceed to read back (verify after program) the content stored in the data block corresponding to the specific address from the OTP memory 200, to verify that the byte data has been written into the OTP memory 200 successfully. If the read content is different from the written byte data, the control unit 110 may determine that the data block corresponding to the specific address is damaged and can not be used. Next, the control unit 110 performs an error recovering procedure, so as to write the byte data and the specific address into a data block of the error recovering section 250. In the embodiment, the control unit 110 searches the error recovering section 250 with a bottom-up approach, to find the empty data blocks in the error recovering section 250, so as to perform the error recovering procedure. If the empty data blocks exist, the control unit 110 writes the byte data and the specific address into a free block that is the first empty data block found in the error recovering section 250. If no empty data block exists, the control unit 110 writes a message representing that updating the OTP memory 220 can not be continued, into the header section 210, thereby the OTP memory 200 only can be read and can not be updated. In the OTP memory 200, any section may have damaged memory cells therein. Therefore, before a data block of the OTP memory 200 is read in response to a read address, the control unit 110 needs to check whether the address stored in the error recovering section 250 is identical to the read address. If yes, the control unit 110 may read the data corresponding to the read address from a data block of the error recovering section 250 due to the original data block of the data section 220 corresponding to the read address being damaged. If no, the control unit 110 may directly read the content from the original data block according to the read address. Furthermore, when the EEPROM version is updated, the control unit 110 may first write an end address of the EEPROM version into the start address stack section 240 and then read it back, so as to determine whether to perform the error recovering procedure for the end address. If the read content is identical to the written end address, the control unit 110 further writes a start address of the EEPROM version into the start address stack section 240 and then reads it back, so as to determine whether to perform the error recovering procedure for the start address. Similarly, if the read content is identical to the written start address, the control unit 110 may determine that the start and end addresses of the EEPROM version have been written into the start address stack section 240 successfully.

Figure 3:
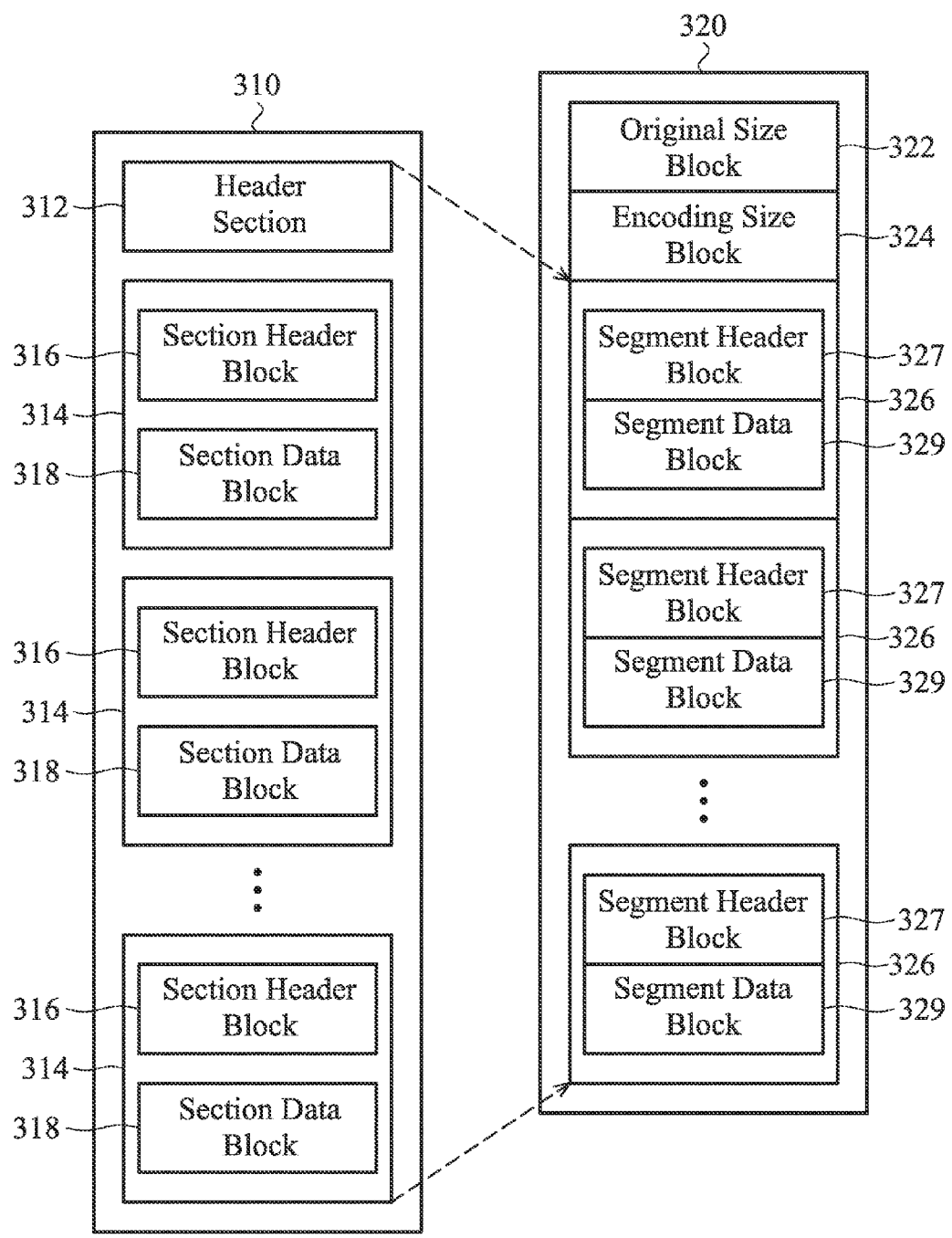
FIG. 3 shows a diagram illustrating encoding an EEPROM version to be updated by the control unit of FIG. 1 according to an embodiment of the invention.

FIG. 3 shows a diagram illustrating encoding an EEPROM version to be updated by the control unit 110 of FIG. 1 according to an embodiment of the invention, wherein label 310 represents a layout diagram illustrating an original data of the ROM code $DATA_{ROM}$ received by the control unit 110, and label 320 represents a layout diagram illustrating an EEPROM data of the ROM code $DATA_{ROM}$ encoded by the control unit 110. First, the original ROM code $DATA_{ROM}$ 310 comprises a header section 312 and a plurality of data sections 314, wherein each data section 314 comprises a section header block 316 and a section data block 318. Next, the control unit 110 encodes the total data sections 314 within the ROM code $DATA_{ROM}$ 310 to obtain a plurality of data segments 326, wherein each data segment 326 comprises a segment header block 327 and a segment data block 329. In addition, the encoded EEPROM data 320 further comprises an original size block 322 and an encoding size block 324, wherein the original size block 322 is used to record an original data length of the ROM code $DATA_{ROM}$ (e.g. 310) and the encoding size block 324 is used to record a data length of the encoded ROM code $DATA_{ROM}$ (e.g. 320). In general, the original data length of the ROM code $DATA_{ROM}$ is larger than that of the encoded ROM code $DATA_{ROM}$.

Figure 4A:
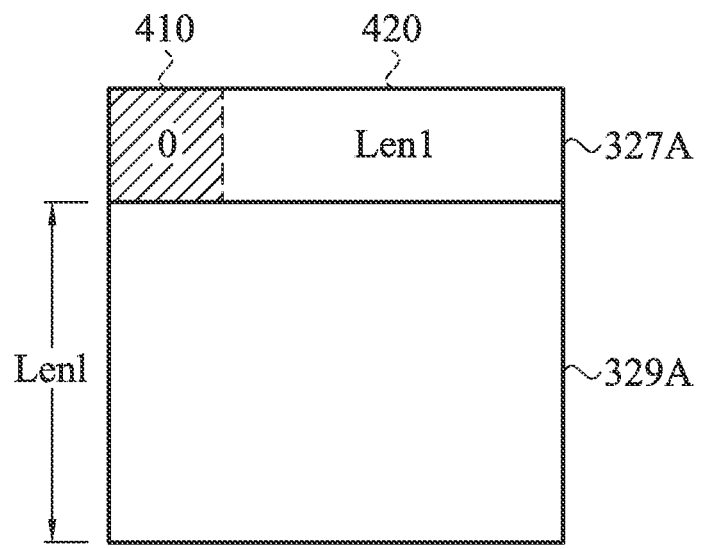
FIG. 4A shows a data segment encoded by a control unit according to an embodiment of the invention.
Figure 4B:
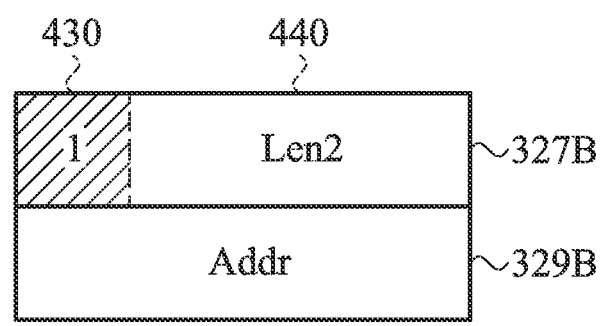
FIG. 4B shows a data segment according to another embodiment of the invention.

Referring to FIG. 1, when the original data of the ROM code $DATA_{ROM}$ is to be encoded and programmed to the OTP memory 120, the control unit 110 may first determine whether the section currently to be encoded in the ROM code $DATA_{ROM}$ and the sections previously written into the OTP memory 120 have the same content. If no, the control unit 110 directly writes the section into the OTP memory 120, as shown in FIG. 4A. FIG. 4A shows a data segment 326A encoded by the control unit 110 of FIG. 1 according to an embodiment of the invention. The data segment 326A comprises a segment header block 327A and a segment data block 329A, wherein the segment header block 327A comprises a flag field 410 and a length field 420. In FIG. 4A, the flag field 410 is set to "0" to indicate that the segment data block 329A is raw data that has not been compressed, and the length field 420 is used to record a data length Len1 of the data in the segment data block 329A that has not been compressed. On the contrary, when it is determined that the section currently to be encoded and a section previously written into the OTP memory 120 have the same content, the control unit 110 will not re-encode the content of the section. At this time, the control unit 110 stores an address corresponding to the section, previously written into the OTP memory 120 and having the same content as the section that is not re-encoded by the control unit 110, into the OTP memory 120, as shown in FIG. 4B. FIG. 4B shows a data segment 326B according to another embodiment of the invention. The data segment 326B comprises a segment header block 327B and a segment data block 329B. Similarly, the segment header block 327B comprises a flag field 430 and a length field 440. In FIG. 4B, the flag field 430 is set to "1" by the control unit 110, so as to indicate that the content stored in the segment data block 329B is a specific address Addr which points to a previously written data segment. Furthermore, the length field 440 is used to record a data length Len2 of the previously written data segment. Therefore, the control unit 110 will not re-encode the sections having the same content, thereby encoding time and data quantity to be stored are decreased.

Figure 5:
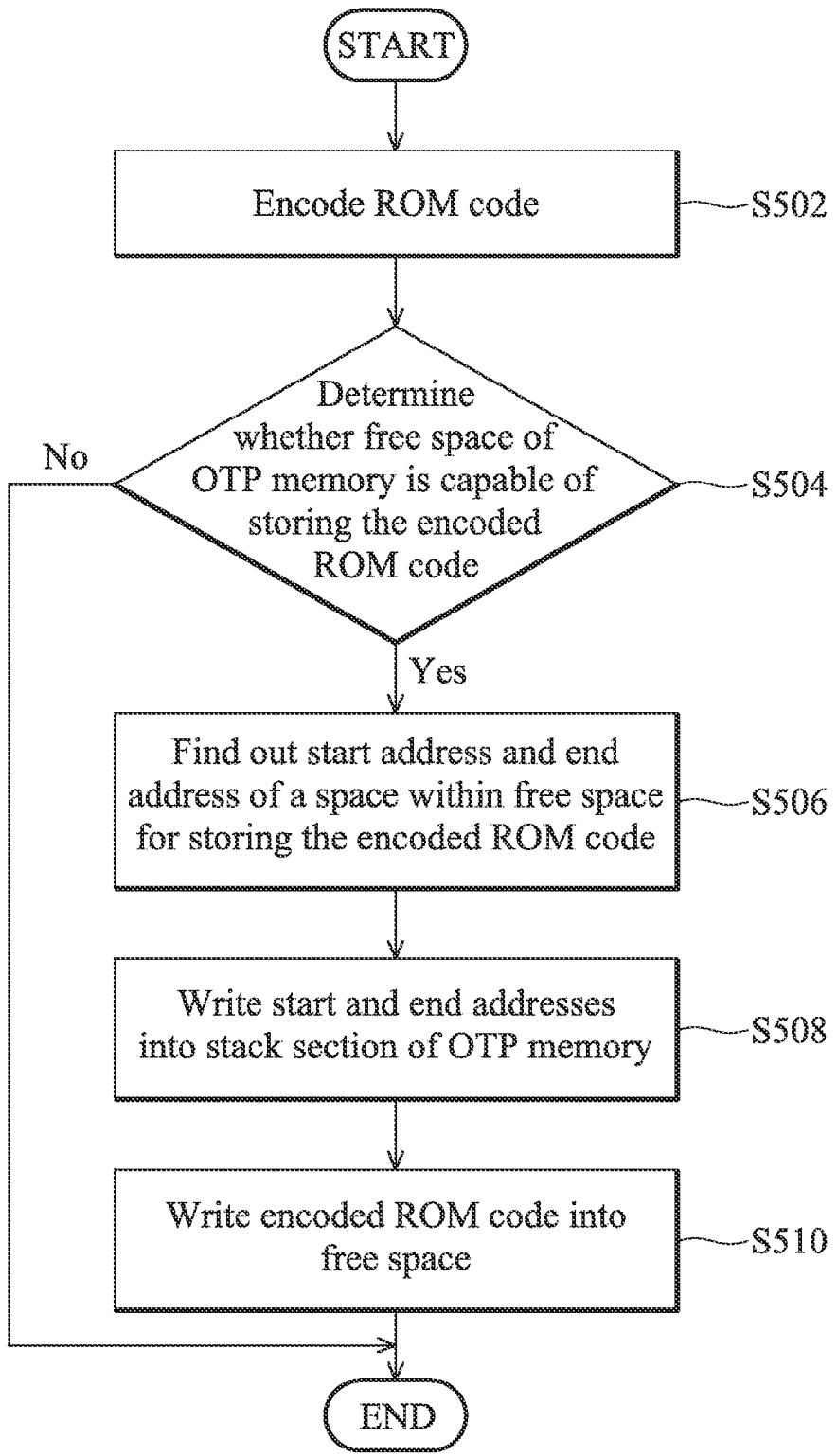
FIG. 5 shows a data programming method according to an embodiment of the invention.

FIG. 5 shows a data programming method for storing a ROM code into an OTP memory by a control unit (e.g 110 of FIG. 1) according to an embodiment of the invention. First, the control unit encodes the ROM code, and obtains a data length of the encoded ROM code (step S502). Next, in step S504, the control unit determines whether a free space of the OTP memory is capable of storing the encoded ROM code according to the data length of the encoded ROM code. If no, the data programming process finishes in step S504. If yes, according to the data length of the encoded ROM code, the control unit finds out a start address and an end address of a space within the free space (step S506), wherein the space of the free space is suitable for storing the encoded ROM code. Next, the control unit writes the start and end addresses into a stack section of the OTP memory (step S508). Next, the control unit writes the encoded ROM code into the space of the free space (step S510). As described above, when the start address, the end address or the encoded ROM code is written into a data block of the OTP memory, the control unit may read back the content of the data block, so as to determine whether the write operation is normal. If yes, the control unit continues to write the subsequent data of the encoded ROM code into the OTP memory. If no, the control unit determines that the data block is damaged, and then the control unit performs an error recovering procedure, so as to store the data to be written and an address corresponding to the damaged data block into an error recovering section of the OTP memory. Thus, the stored content can be read correctly when the control unit or other circuits wants to read the OTP memory. In addition, for the sections of the ROM code that have the same content, the control unit does not re-encode the same content/data, and the control unit stores a specific address into the OTP memory in response to the sections having the same content, wherein the specific address points to a previously written section having the same content, as described above.

Figure 6:
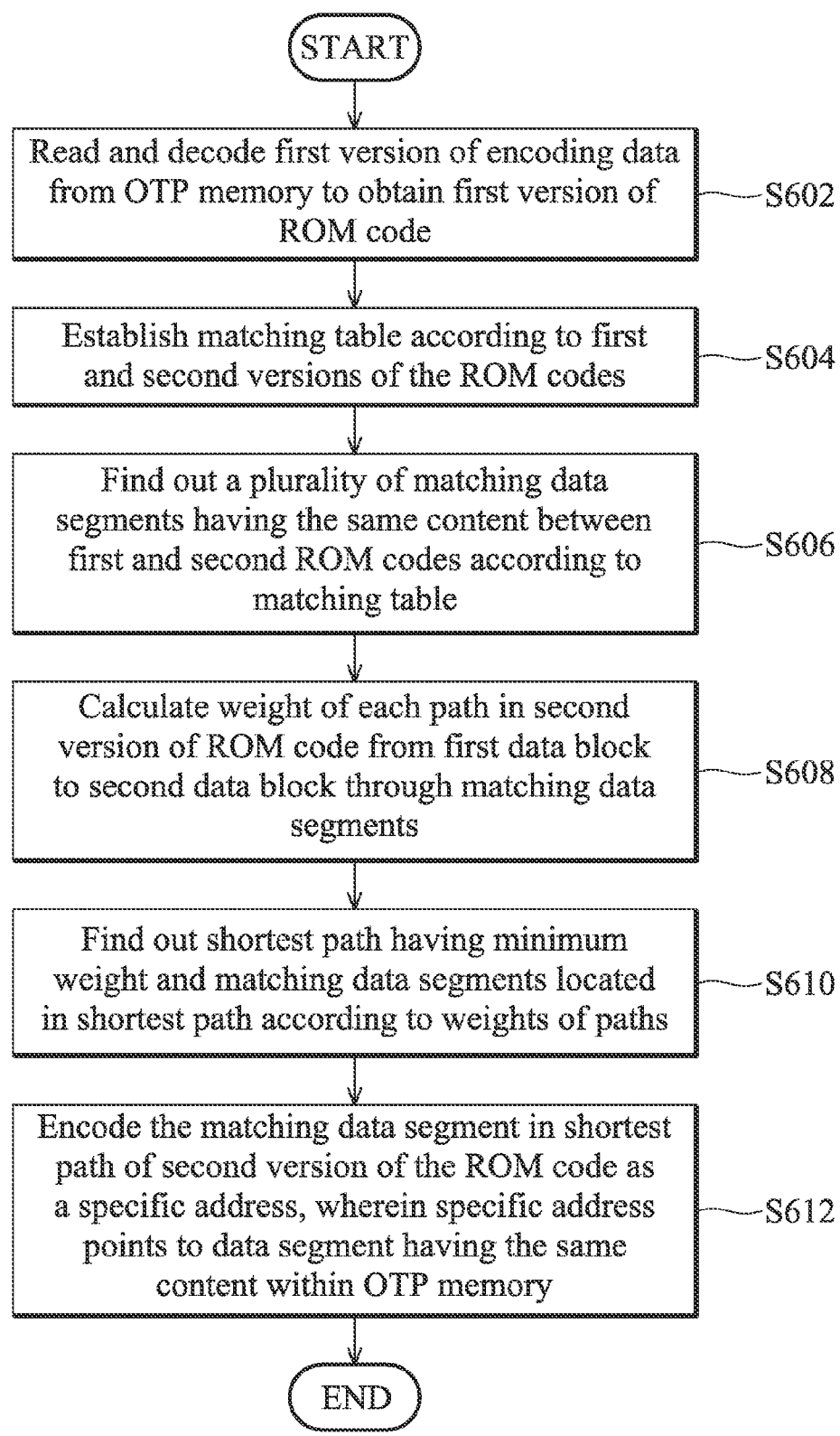
FIG. 6 shows a data programming method according to another embodiment of the invention.
Figure 7:
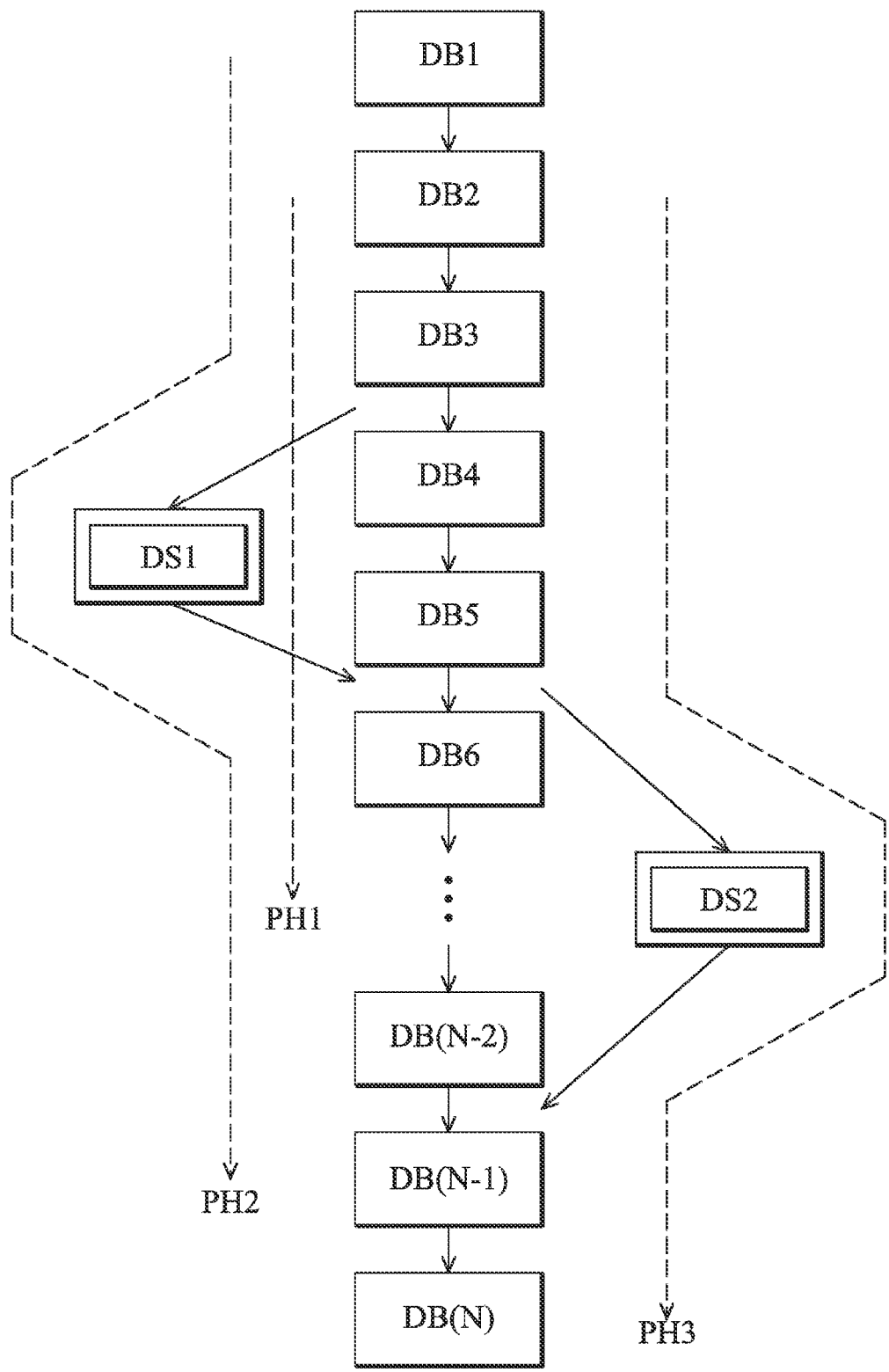
FIG. 7 shows a diagram illustrating various paths in a second version of the ROM code from the data block DB1 to the data block DBN.

FIG. 6 shows a data programming method for storing a second version of the ROM code into an OTP memory according to an embodiment of the invention, wherein a first version of the encoding data corresponding to a first version of the ROM code is stored in the OTP memory. First, in step S602, the control unit reads the first version of the encoding data from the OTP memory, and decodes the first version of the encoding data to obtain the first version of the ROM code. Next, in step S604, the control unit establishes a matching table according to the first and second versions of the ROM codes. For example, the control unit may obtain the matching table between different versions of the ROM codes by using the longest common subsequence algorithm. Next, in step S606, the control unit finds out a plurality of matching data segments having the same content between the first and second ROM codes according to the matching table. Furthermore, in one embodiment, the control unit further selects the matching data segments with a data length larger than a specific threshold length from the plurality of matching data segments, so as to simplify subsequent operations. Next, in step S608, the control unit calculates a weight of each path in the second version of the ROM code from a first data block to a second data block through the matching data segments. For example, referring to FIG. 7, FIG. 7 shows a diagram illustrating various paths in the second version of the ROM code from a data block DB1 to a data block DBN. In FIG. 7, a path PH1 shows a path from the data block DB1 to the data block DBN which is sequentially through the data blocks DB2, DB3, . . . , DB(N-2) and DB(N-1). A path PH2 shows a path from the data block DB1 to the data block DBN which is sequentially through the data blocks DB2 and DB3, a matching data segment DS1 and the data blocks DB6 to DB(N-1). A path PH3 shows a path from the data block DB1 to the data block DBN which is sequentially through the data blocks DB2-DB5, a matching data segment DS2 and the data block DB(N-1). Thus, the control unit may calculate the weights of the paths PH1, PH2 and PH3, respectively. In the embodiment, for a data block, the weight is obtained according to the occupied space of the data block in the OTP memory. In addition, each matching data segment (e.g. DS1 and DS2) corresponds to a specific data segment of the first version of the encoding data stored in the OTP memory. Thus, when wanting to store a matching data segment of the second version of the ROM code into the OTP memory, the control unit encodes the matching data segment as a specific address which points to a corresponding specific data segment of the first version of the encoding data in the OTP memory. Therefore, if the control unit wants to store the matching data segment into the OTP memory, the control unit only needs to write the specific address into the OTP memory and not all of the data blocks within the matching data segment, as shown in FIG. 4B. In the embodiment, each of the matching data segments may correspond to a specific address of the first version of the encoding data in the OPT memory, i.e. each of the matching data segments is encoded as a specific address by the control unit. Therefore, each of the matching data segments has the same weight, which has no relationship with a quantity of data blocks therein.

Referring to FIG. 6 and FIG. 7 together, in step S610, the control unit finds out a shortest path having a minimum weight and the matching data segments located in the shortest path according to the weights of the paths obtained in step S608. For example, in the example of FIG. 7, the control unit finds that the path PH3 is the shortest path having the minimum weight, and finds the matching data segment DS2 located in the path PH3. Next, in step S612, the matching data segment in the shortest path of the second version of the ROM code is encoded as a specific address, wherein the specific address points to the data segment having the same content within the OTP memory. Therefore, after the total shortest paths of the second version of the ROM code are found out and encoded, the control unit starts to store the second version of the encoded ROM code into the OTP memory. As described above, if the second version of the encoded ROM code is being stored into the OTP memory by the control unit, the control unit also needs to check the free space of the OTP memory, and then writes the start and end addresses into the start address stack section and determines whether to perform the error recovering procedure, as described in FIG. 5.

Figure 8:
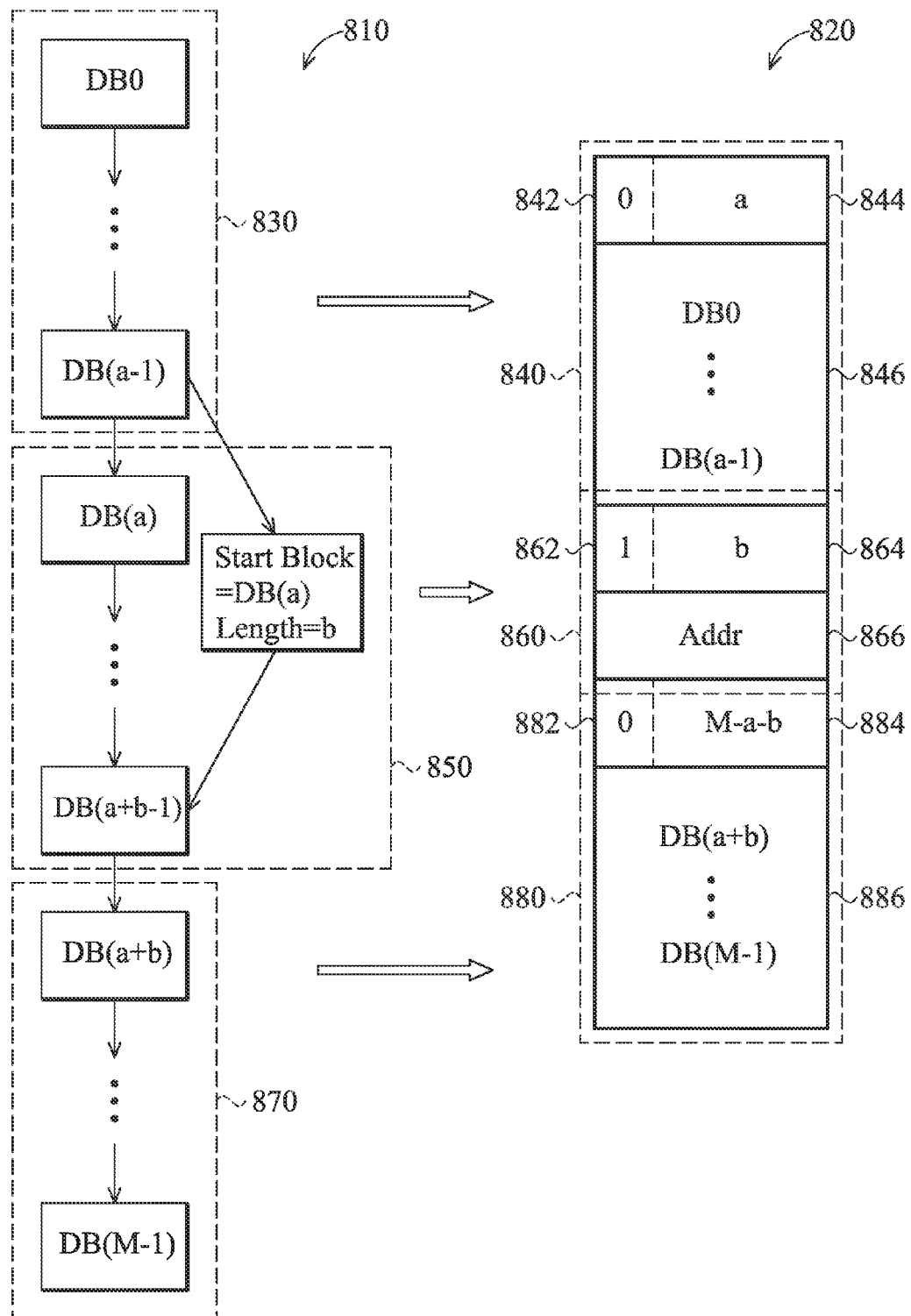
FIG. 8 shows a diagram illustrating encoding an EEPROM version to be updated by the control unit of FIG. 1 according to another embodiment of the invention.

FIG. 8 shows a diagram illustrating encoding an EEPROM version to be updated by the control unit 110 of FIG. 1 according to another embodiment of the invention, wherein label 810 represents a layout diagram illustrating an original data of the ROM code $DATA_{ROM}$ received by the control unit 110, and label 820 represents a layout diagram illustrating an EEPROM data of the ROM code $DATA_{ROM}$ encoded by the control unit 110 according to the data programming method of FIG. 6. First, by searching for the shortest path having the minimum weight, the control unit 110 divides the ROM code $DATA_{ROM}$ into three data sections 830, 850 and 870, wherein the data section 850 has the shortest path having the minimum weight and corresponds to a specific data segment stored in the OTP memory, i.e. the data section 850 and the stored specific data segment have the same content. For the data sections 830 and 870, the control unit 110 directly and sequentially encodes the data blocks DB0 to DB(a−1) of the data section 830 into a data segment 840 and the data blocks DB(a+b) to DB(M−1) of the data section 870 into a data segment 880. In the data segment 840, the control unit 110 sets a flag field 842 to "0", to indicate that a segment data block 846 is raw data that has not been compressed (i.e. the data blocks DB0 to DB(a−1)), and stores a data length "a" into a length field 844. Similarly, in data segment 880, the control unit 110 sets a flag field 882 to "0", to indicate that a segment data block 886 is raw data that has not been compressed (i.e. the data blocks DB(a+b) to DB(M−1)), and stores a data length "M−a−b" into a length field 884. Furthermore, for the data section 850, the matching data segment in the shortest path comprises a plurality of data blocks between the data blocks DB(a−1) and DB(a+b). Therefore, in the shortest path, the control unit 110 may obtain that a start block of the matching data segment is DB(a), and a data length of the matching data segment (a quantity of data blocks within the matching data segment) is "b". Thus, in a data segment 860, the control unit 110 sets a flag field 862 to "1", to indicate that content of a segment data block 866 is a specific address Addr which points to a previously written specific data segment comprising data blocks DB(a) to DB(a+b−1). Moreover, the control unit 110 stores the data length "b" of the matching data segment into a length field 864. Finally, the control unit 110 sequentially writes the data segments 840, 860 and 880 into the free space of the OTP memory, so as to store the ROM code $DATA_{ROM}$ to be updated into the OTP memory.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data programming circuit, comprising:
   a one-time-programmable (OTP) memory, storing a first version of the encoding data corresponding to a first version of a read-only memory (ROM) code; and
   a control unit, storing a second version of the ROM code into the OTP memory, wherein the control unit obtains a matching table according to the first version of the encoding data and the second version of the ROM code, and obtains a first data segment of the first version of the encoding data and a second data segment of the second version of the ROM code that have the same content, according to the matching table,
   wherein the control unit encodes the second data segment as a specific address, and the specific address points to the first data segment of the first version of the encoding data in the OTP memory,
   wherein the control unit obtains a plurality of matching data segments having the same content between the first version of the encoding data and the second version of the ROM code according to the lookup table, wherein a data length of each of the plurality of matching data segments is larger than a specific threshold length,
   wherein the control unit calculates a weight of each path in the second version of the ROM code from a first data block to a second data block through the matching data segments, so as to find out a shortest path having a minimum weight from the paths and to find the second data segment corresponding to the shortest path from the matching data segments, wherein each of the matching data segments comprises a plurality of data blocks and the data length of each of the matching data segments is a quantity of the plurality of data blocks.

2. The data programming circuit as claimed in claim 1, wherein each of the matching data segments has the same weight between the first and second data blocks.

3. The data programming circuit as claimed in claim 1, wherein a start point of the shortest path is the first data block and an end point of the shortest path is the second data block, and the second data segment comprises a plurality of data blocks between a third data block and a fourth data block in the shortest path.

4. The data programming circuit as claimed in claim 3, wherein the control unit sequentially stores the data blocks from the first data block to the third data block of the shortest path, into a first segment of the OTP memory, and the control unit sequentially stores the data blocks from the fourth data block to the second data block of the shortest path, into a second segment of the OTP memory.

5. The data programming circuit as claimed in claim 4, wherein the control unit stores the specific address into a third segment of the OTP memory, so as to indicate that the data blocks of the second data segment in the shortest path is identical to that of the first data segment of the first version of the encoding data, wherein the third segment is between the first and second segments.

6. A data programming method for a one-time-programmable (OTP) memory, wherein a first version of the encoding data corresponding to a first version of a read-only memory (ROM) code is stored in the OTP memory, comprising:
   reading the first version of the encoding data from the OTP memory and decoding the first version of the encoding data to obtain the first version of the ROM code;
   encoding a second version of the ROM code according to the first version of the ROM code; and
   storing the second version of the encoded ROM code into the OTP memory,
   wherein the step of encoding the second version of the ROM code further comprises:
   obtaining a matching table according to the first and second versions of the ROM codes;
   obtaining a first data segment of the first version of the encoding data and a second data segment of the second version of the ROM code that have the same content, according the matching table; and
   encoding the second data segment as a specific address, and the specific address points to the first data segment of the first version of the encoding data in the OTP memory,
   wherein the step of encoding the second version of the ROM code further comprises:
   obtaining a plurality of matching data segments having the same content between the first version of the encoding data and the second version of the ROM code according to the lookup table, wherein a data length of each of the plurality of matching data segments is larger than a specific threshold length;
   calculating a weight of each path in the second version of the ROM code from a first data block to a second data block through the matching data segments; and
   finding out a shortest path having a minimum weight from the paths and finding out the second data segment corresponding to the shortest path from the matching data segments according to the weights of the paths,
   wherein each of the matching data segments comprises a plurality of data blocks, and the data length of each of the matching data segments is a quantity of the plurality of data blocks.

7. The data programming method as claimed in claim 6, wherein each of the matching data segments has the same weight between the first and second data blocks.

8. The data programming method as claimed in claim 6, wherein a start point of the shortest path is the first data block and an end point of the shortest path is the second data block, and the second data segment comprises a plurality of data blocks between a third data block and a fourth data block in the shortest path.

9. The data programming method as claimed in claim 8, wherein the step of storing the second version of the encoded ROM code into the OTP memory further comprises:
   sequentially storing the data blocks from the first data block to the third data block of the shortest path, into a first segment of the OTP memory; and
   sequentially storing the data blocks from the fourth data block to the second data block of the shortest path, into a second segment of the OTP memory.

10. The data programming method as claimed in claim 9, wherein the step of storing the second version of the encoded ROM code into the OTP memory further comprises:
   storing the specific address into a third segment of the OTP memory, so as to indicate that the data blocks of the second data segment in the shortest path is identical to that of the first data segment of the first version of the encoding data,
   wherein the third segment is between the first and second segments.

* * * * *